United States Patent [19]
Jung et al.

[11] Patent Number: 5,699,304
[45] Date of Patent: Dec. 16, 1997

[54] DYNAMIC LEVEL CONVERTER OF A SEMICONDUCTOR MEMORY DEVICE

[75] Inventors: Chul-Min Jung; Seung-Kweon Yang, both of Seoul, Rep. of Korea

[73] Assignee: Samsung Electronics Co., Ltd., Suwon, Rep. of Korea

[21] Appl. No.: 653,056

[22] Filed: May 24, 1996

[30] Foreign Application Priority Data

May 25, 1995 [KR] Rep. of Korea ............ 13275/1995

[51] Int. Cl.$^6$ .................................................. G11C 7/00
[52] U.S. Cl. .................................. 365/189.11; 365/205
[58] Field of Search .................. 365/205, 189.11; 327/57

[56] References Cited

U.S. PATENT DOCUMENTS

| | | | |
|---|---|---|---|
| 4,716,320 | 12/1987 | McAdams | 365/205 |
| 5,041,746 | 8/1991 | Webster et al. | 365/189.11 |
| 5,577,000 | 11/1996 | Asami | 365/205 |

Primary Examiner—David C. Nelms
Assistant Examiner—Michael T. Tran
Attorney, Agent, or Firm—Cushman Darby & Cushman, IP Group of Pillsbury Madison & Sutro LLP

[57] ABSTRACT

A level converter for use in a semiconductor memory device includes a level converting unit, a latch circuit and a blocking circuit. The level converting unit receives sensed first and second sensing voltages and a control clock and which provides level-converted first and second output voltages in correspondence with the first and second sensing voltage at first and second output nodes in response to the control clock. The latch circuit boosts a difference between the first and second output voltages provided at the first and second output nodes to be substantially equal to the level of a supply voltage in response to the application of the supply voltage. The blocking circuit controls the application of the supply voltage to the level converting unit and the latch circuit according to the control clock, in order to reduce current consumption due to the application of the supply voltage and to achieve a high operating speed.

15 Claims, 2 Drawing Sheets

DYNAMIC LEVEL CONVERTER OF A SEMICONDUCTOR MEMORY DEVICE

BACKGROUND OF THE INVENTION

1. Field of the Invention

The present invention relates to a level converter of a semiconductor memory device, and more particularly, to a dynamic level converter capable of reducing current consumption and operating at a high speed. The present application is based on Korean Application No. 13275/1995, which is incorporated herein by reference for all purposes.

2. Description of the Related Art

In a semiconductor memory device, a sense amplifier senses data stored in a memory cell and amplifies the sensed data. Generally, a level converter is provided to level-convert the sense amplifier output and to transmit the level-converted output to a data output buffer. The output of a typical biCMOS-designed sense amplifier is an ECL (emitter coupled logic) level. Therefore, the level converter performs a function of converting the output of the sense amplifier into a full swing level. FIG. 1B shows the circuit diagram of a conventional level converter which performs the function as mentioned above.

In FIG. 1B, first and second outputs of the sense amplifier shown in FIG. 1A are respectively indicated as signals "Sas" and "SasB". The sense amplifier has the same configuration as that of the sense amplifier used generally in this field, and senses the voltage applied to each bit line of the semiconductor memory cell to thereby provide output voltages from 1.5 volts to 2.4 volts as first and second output voltages. The first and second outputs Sas and SasB are respectively applied to PMOS transistors M1 and M2 of FIG. 1B. The level converter includes a current mirror configuration comprising a PMOS transistor and an NMOS transistor, and a driving inverter INV using a bipolar element. The level converter receives the first and second outputs Sas and SasB to thereby output an output DOUP having a voltage level as shown in FIG. 1C.

Explanation will now be given of the output voltage DOUP generated when the first and second outputs Sas and SasB are respectively changed to a logic "high" level (2.4 volt) or to logic "low" level (1.5 volt). As can be seen in FIG. 1C, as the second output SasB is changed from 2.4 volts to 1.5 volts and the first output Sas is changed from the 1.5 volts to 2.4 volts, PMOS transistor M1 of FIG. 1B gradually operates to provide a channel current to node N1. Accordingly, the current of node N1 induces the gate voltage of NMOS transistor M3. Meanwhile, PMOS transistor M2 is gradually turned off to reduce the current flowing in node N2. NMOS transistors M3 and M4 operate by the voltage of the node N1 to thereby pass the current flowing at nodes N1 and N2 to ground, and thereby the node N2 becomes the logic "low" state. Inverter INV inverts the logic "low" state into the logic "high" state, thereby outputting the output DOUP as the logic "high" state of the CMOS level.

In the level converter operating as described above, when the second output SasB is the logic "low" state, a static current flows continuously through the transistor M1. In a semiconductor memory device having multiple input/output ports, a level converter (or shifter) is required for each input/output port and accordingly, a large amount of current is required to operate all of the level converters. That is, the conventional level converter continually consumes current during a specific period of time and consequently, the semiconductor memory device having multiple input/output ports consumes a large amount of current.

As for operating speed, the level converter has an inherent speed delay even when the load of an output is negligible because the current of the output node is charged or discharged according to the channel current difference of transistors in a current mirror structure. It is well known that even devices manufactured for fast processing have speed delays of more than 0.5 ns. This delay phenomenon is unavoidable, but it is preferable to design the device to have shorter delay.

Moreover, a swing between the high and low levels of first and second outputs Sas and SasB changes according to process variations of resistance and reference voltage Vref in the sense amplifier of FIG. 1A. Accordingly, when using the level converter as described above, it is very difficult to estimate the total amount of current to be consumed.

As evident from the foregoing, there is a need in the art for a level converter which overcomes the conventional disadvantages of large current consumption and inherent speed delays. The present invention fulfills this need.

SUMMARY OF THE INVENTION

Accordingly, it is an object of the present invention to provide a converter of a semiconductor memory device improved to overcome the conventional advantages.

It is another object of the present invention to provide a level converter capable of reducing current consumption.

It is further another object of the present invention to provide a level converter of a synchronous semiconductor memory device capable of operating at high speeds.

To achieve these and other objects, a level converter according to the principles of the present invention includes a level converting unit, a latch circuit and a blocking circuit. The level converting unit receives sensed first and second sensing voltages and a control clock and which provides level-converted first and second output voltages in correspondence with the first and second sensing voltage at first and second output nodes in response to the control clock. The latch circuit boosts a difference between the first and second output voltages provided at the first and second output nodes to be substantially equal to a level of the supply voltage in response to the application of a supply voltage. The blocking circuit controls the application of the supply voltage to the level converting unit and the latch circuit according to the control clock, in order to reduce current consumption due to the application of the supply voltage and to achieve a high operating speed.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar elements components, and wherein.

DETAILED DESCRIPTION OF THE PREFERRED EMBODIMENT

Figure 1A:
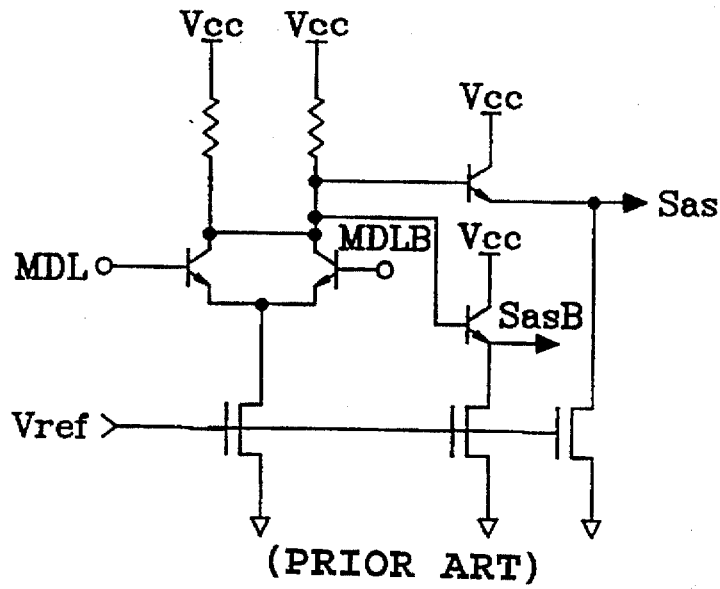
FIG. 1A is a circuit diagram illustrating a conventional sense amplifier in a semiconductor memory device.
Figure 1B:
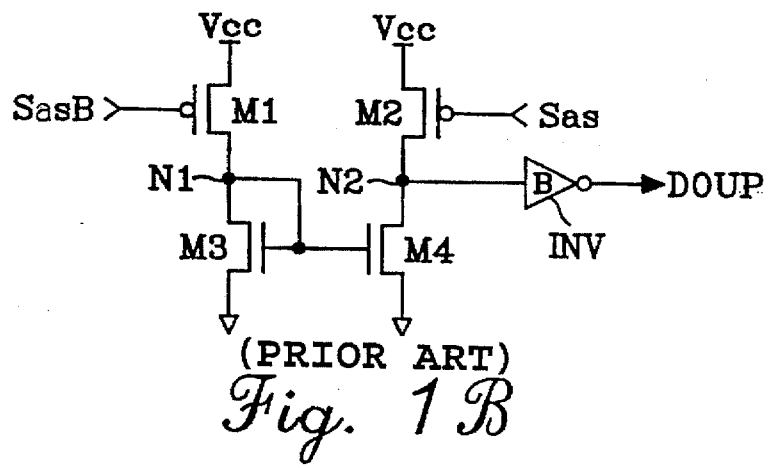
FIG. 1B is a circuit diagram illustrating a conventional level converter in a semiconductor memory device.
Figure 1C:
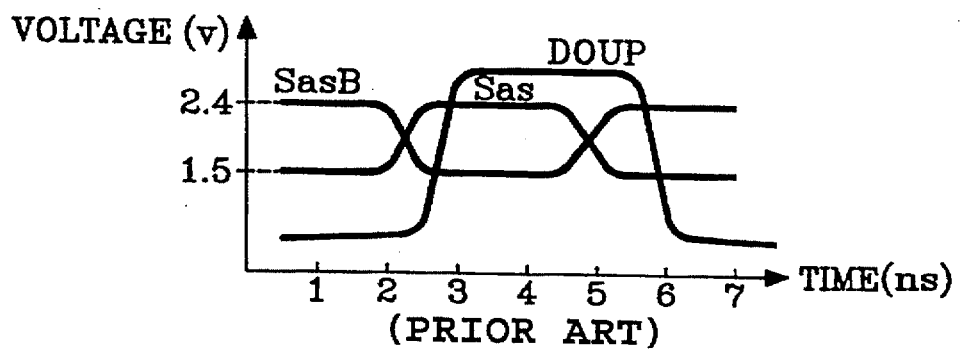
FIG. 1C is a waveform diagram showing operational characteristics of the conventional level converter shown in FIG. 1B.
Figure 2A:
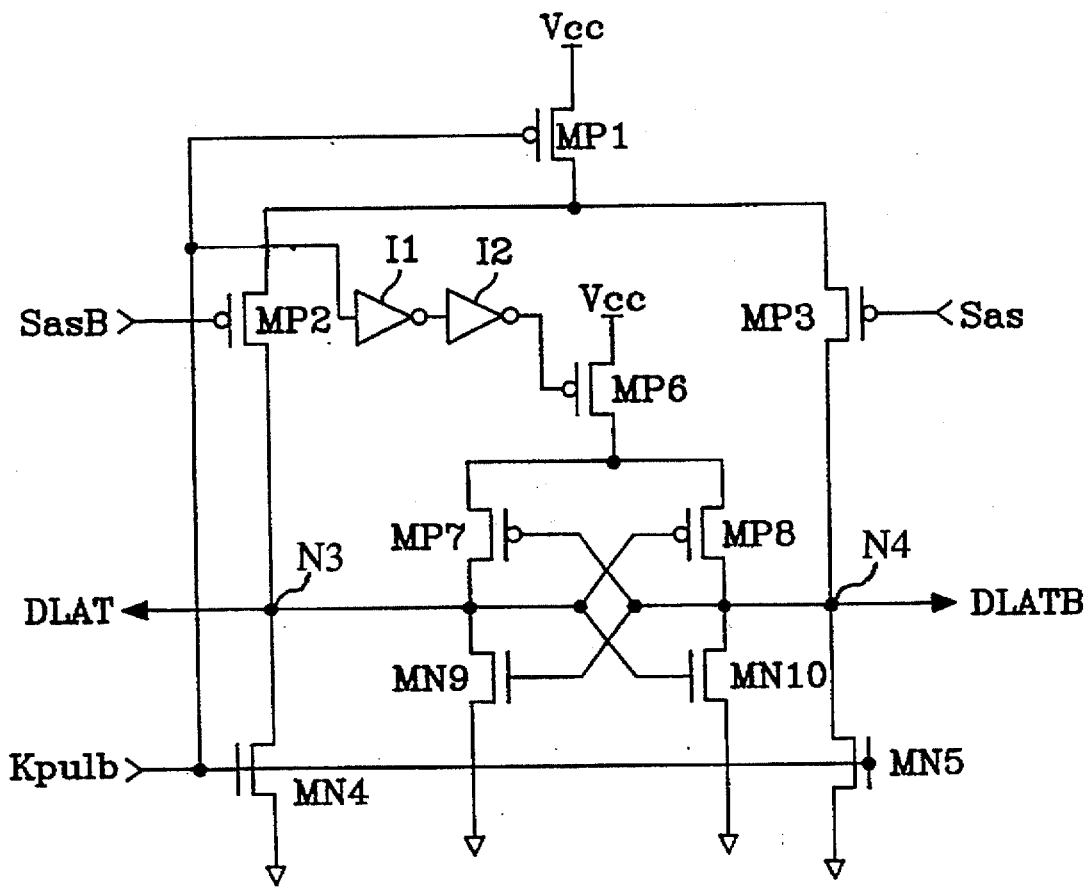
FIG. 2A is a circuit diagram illustrating a dynamic level converter constructed according to the principles of the present invention.

FIG. 2A shows a level converter in accordance with one embodiment of the present invention. As shown, a pair of PMOS transistors MP2 and MP3 have their sources connected together and have their gates respectively connected to sensed first and second sensing voltages Sas and SasB. A pair of NMOS transistors MN4 and MN5, whose sources are grounded and whose drains are respectively connected to the drains of transistors MP2 and MP3, receive in common a control clock Kpulb through each gate thereof. First and second output nodes N3 and N4, respectively located at drain connection points between transistors MP2 and MN4 and between transistors MP3 and MN5, supply level-converted first and second output voltages DLAT and DLATB in correspondence with first and second sensing voltages Sas and SasB during a predetermined first period of time. The configuration mentioned above serves as the level converting unit in the level converter.

A first PMOS transistor MP1 applies supply voltage Vcc to the sources of transistors MP2 and MP3 during the predetermined first period of time in response to the control clock Kpulb, and a second PMOS transistor MP6 applies the supply voltage Vcc to the sources of transistors MP7 and MP8 during a predetermined second period of time in response to the control clock Kpulb. The configuration described above serves as a blocking means in the level converter.

In order to reduce current consumption due to a passing of the supply voltage and to achieve high operating speeds, a latching unit boosts a difference of first and second output voltages between the first and the second output nodes to be substantially equal to a level of the supply voltage Vcc in response to the supply voltage applied from transistor MP6 during the predetermined second period of time. The latch unit includes PMOS transistors MP7 and MP8 which receive in common the output voltage of transistor MP6 through sources thereof, and transistors MN9 and MN10 which have their drains respectively connected to each drain of transistors MP7 and MP8 and their sources connected to ground. The gate of transistor MP7 and the gate of transistor MN9 are jointly connected to second output node N4, and the gate of transistor MP8 and the gate of transistor MN10 are jointly connected to first output node N3. Moreover, the blocking means includes delaying units I1 and I2 which delay the supply of the control clock to transistor MP6 in order to cause transistor MP6 to operate during the predetermined second period of time.

In the operation of the level converter, the control clock Kpulb is synchronized to the operation clock of the semiconductor memory device. This kind of clock is easily obtained in a synchronous semiconductor memory device. Accordingly, in the embodiment of the present invention, it should be noted that only during a period where the clock Kpulb is in a logic "low" state, are first and second sensing voltages Sas and SasB received and are first and second output voltages DLAT and DLATB generated.

When the control clock Kpulb is in the logic "high" state, transistors MP1 and MP6 are turned off, and thereby both first and second output nodes N3 and N4 are precharged to the logic "low" level. Subsequently, in periods where the control clock Kpulb is applied as the logic "low" state, transistors MN4 and MN5 serving as precharge transistors are turned off, and thereby the first and second output nodes go to a floating state. At this time, the logic states of output voltages DLAT and DLATB are determined according to which of the transistors MP2 and MP3 is more fully turned on by each of the first and second sensing voltages Sas and SasB.

Figure 2B:
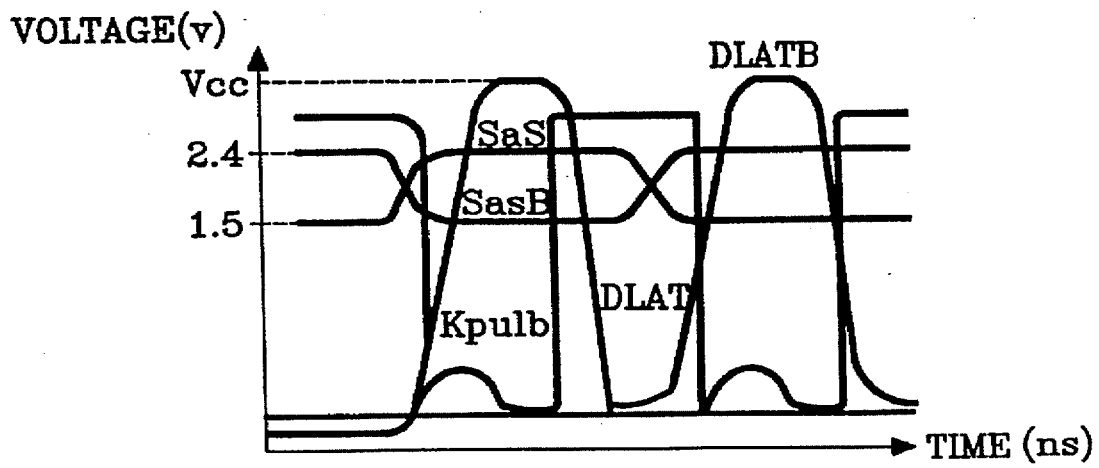
FIG. 2B is a waveform diagram showing operational characteristics of the dynamic level detector in accordance with the present invention shown in FIG. 2A.

When the control clock Kpulb having the logic "low" state is applied through delay units I1 and I2, the latch unit comprising the transistors MP7, MP8, MN9 and MN10 operates. To reduce current consumption due to the passing of the supply voltage and to achieve a high operating speed, the latch unit boosts the difference between the first and second output voltages at the first and second output nodes to be substantially equal to the level of the supply voltage Vcc in response to the supply voltage supplied from the transistor MP6. The period when the latch unit operates is delayed through the delay unit, and is referred to as the predetermined second period of time. As can be seen in FIG. 2B, the voltages applied to the first and second output nodes go to the logic "high" and "low" levels equal to the level of the supply voltage through the operation of the latch unit.

Meanwhile, the control clock Kpulb is applied as the logic "high" state during the precharge operation for the internal cell of the semiconductor memory device and thereby, the transistors MP1 and MP6 remain turned off. Accordingly, no current flows from the supply voltage in the level converter. During a data sampling period, the control clock Kpulb is applied as the logic "low" state. Accordingly, the transistors MN4 and MN5 are turned off, and the latch unit comprising the transistors MP7, MP8, MN9 and MN10 is turned on or turned off, such that the state thereof is set as the logic "high" or "low" state. In this case, no static DC current flows, except for a transient current by which the transistor is turned on. The amount of transient current consumed in the delay unit and the latch unit is smaller than that consumed in the general latch due to the first and second nodes being precharged.

Moreover, an evaluation speed of the DLAT and DLATB is defined as when transistors MN4 and MN5 are turned off and the level of DLAT or DLATB rise to a level approximately that of the supply voltage according to the first and second sensing voltages. That is, while the conventional level converter is driven by the difference of currents simultaneously flowing through the supply voltage and the ground transistor, the level converter in accordance with the present invention is driven by the current of the supply voltage side when the ground transistor is turned off. Accordingly, the level converter of the present invention operates at a high speed compared with the conventional level converter. Further, when either one of the sensing voltages is the logic "high" state by operation of the latch unit, the phenomenon that the level of the DLAT and DLATB is raised to the level of the supply voltage can be prevented due to a leakage current through transistors MP2 and MP3, and thereby safe operation of the circuit can be ensured.

The level converter as described hereinabove has advantages in that the consumption of current is reduced and the operating speed thereof can be improved.

It should be understood that the present invention is not limited to the particular embodiment disclosed herein as the best mode contemplated for carrying out the present invention. Rather, those skilled in the art will readily appreciate that various substitutions and modifications can be made thereto without departing from the spirit and scope of the invention as defined in the appended claims.

What is claimed is:

1. A semiconductor memory device comprising:
   a control clock that generates a control signal;
   a sense amplifier which senses data stored in a memory cell and outputs sensed data corresponding thereto, said sensed data having one of a first logic level and a second logic level opposite said first logic level; and
   a level converter which receives said sensed data and, in response to said control signal, transmits output data having one of a first output level and a second output level, said first and second output levels respectively corresponding to said first and second logic levels, said level converter including
      a converting circuit which determines the logic level of said sensed data,
      a latch circuit which boosts said determined logic level to correspond to said one corresponding output level, and
      a control circuit which controls the operations of said converting circuit and said latch circuit in response to said control signal to reduce current consumption of said level converter.

2. The semiconductor device according to claim 1, wherein said level converter further includes a precharge circuit which precharges said output data to one of said first and second output levels when said control signal is not received.

3. The semiconductor device according to claim 1, wherein said control circuit of said level converter further includes a delay circuit which delays the operation of said latch circuit for a predetermined time after the operation of said converting circuit.

4. A level converter of a semiconductor memory device comprising:
   a level converting unit including
      first and second transistors of a first conductivity type which have their sources connected together and which respectively receive first and second sensing voltages through gates thereof,
      third and fourth transistors of a second conductivity type opposite said first conductivity type which have their sources grounded and their drains respectively connected to drains of said first and second transistors and which commonly receive a control clock through gates thereof, and
      first and second output nodes at drain connection points respectively between said first and third transistors and said second and fourth transistors, said level converting unit providing level-converted first and second output voltages in correspondence with said first and second sensing voltages at a first predetermined period of time;
   a blocking circuit including
      a fifth transistor of said first conductivity type which applies a supply voltage to sources of said first and second transistors during said first predetermined period of time in response to said control clock, and
      a sixth transistor of said first conductivity type which applies said supply voltage during a second predetermined period of time in response to said control clock; and
   a latch circuit which boosts a difference between said first and second output voltages respectively provided at said first and second output nodes to an amount substantially equal to a voltage level of said supply voltage during said second predetermined period of time in response to said supply voltage provided through said sixth transistor.

5. A level converter according to claim 4, wherein said latch circuit includes:
   seventh and eighth transistors of said first conductivity type which are commonly coupled to an output of said sixth transistor through sources thereof; and
   ninth and tenth transistors of said second conductivity type which have their drains respectively connected to drains of said seventh and eighth transistors and their sources grounded, gates of said seventh and ninth transistors being jointly connected to said second output node, and gates of said eighth and tenth transistors being jointly connected to said first output node.

6. A level converter according to claim 4, wherein said blocking circuit further includes a delay unit which delays the supply of said control clock to a gate of said sixth transistor.

7. A level converter according to claim 4, wherein said first conductivity type transistors are PMOS transistors.

8. A level converter according to claim 4, wherein said second conductivity type transistors are NMOS transistors.

9. A level converter for a semiconductor memory device having a control clock which outputs a control signal and a sense amplifier which senses data stored in a memory cell and outputs sensed data corresponding thereto, said level converter comprising:
   a converting circuit which receives said sensed data and determines a logic level thereof;
   a latch circuit which boosts said determined logic level and supplies output data to an output node, said output data having one of a first output level and a second output level in correspondence with said determined logic level; and
   a control circuit which receives said control signal and controls the operations of said converting circuit and said latch circuit in response thereto, so as to reduce current consumption of said level converter.

10. The level converter according to claim 9, further comprising:
   a precharge circuit which precharges said output data to one of said first and second output levels when said control signal is not received.

11. The level converter according to claim 9, further comprising:
   a delay circuit which delays the operation of said latch circuit for a predetermined time after the operation of said converting circuit.

12. A level converter for a semiconductor memory device having a sense amplifier which senses data stored in a memory cell and outputs sensed data corresponding thereto, said sense amplifier outputting said sensed data by establishing one of a first and second voltage difference between first and second sensing signals, said first voltage difference corresponding to a first logic level, said second voltage difference corresponding to a second logic level opposite said first logic level, said level converter comprising:
   first and second data output nodes;
   a converting circuit which receives said first and second sensing signals and establishes one of a third and fourth voltage difference across said first and second data output nodes in response to said first and second sensing voltages having said first and second voltage differences, respectively; and
   a latch circuit, coupled to said first and second data output nodes, that responds to the voltage difference established across said first and second data output nodes by said converting circuit, and boosts it to one of a fifth and sixth voltage difference, correspondingly greater than said third and fourth voltage differences, respectively.

13. A level converter according to claim 12, wherein said semiconductor memory device further includes a control clock that generates a control signal, said level converter further comprising:

a control circuit which receives said control signal and controls the operations of said converting circuit and said latch circuit in response thereto, so as to reduce current consumption of said level converter.

14. The level converter according to claim 13, further comprising:

a precharge circuit which precharges said first and second data output nodes to a predetermined output level when said control signal is not received.

15. The level converter according to claim 12, further comprising:

a delay circuit which delays the operation of said latch circuit for a predetermined time after the operation of said converting circuit.

* * * * *